United States Patent
Kang

(10) Patent No.: US 6,870,779 B2
(45) Date of Patent: Mar. 22, 2005

(54) RESET CIRCUIT AND FERAM USING THE SAME

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/608,440

(22) Filed: Jun. 30, 2003

(65) Prior Publication Data

US 2004/0095171 A1 May 20, 2004

(30) Foreign Application Priority Data

Nov. 14, 2002 (KR) .................................. 10-2002-0070602

(51) Int. Cl.[7] .................................................. G11C 7/00
(52) U.S. Cl. ............................. 365/189.11; 365/189.09
(58) Field of Search ...................... 365/189.09, 189.11, 365/226, 241; 265/189.05

(56) References Cited

U.S. PATENT DOCUMENTS

| | | |
|---|---|---|
| 5,305,269 A * | 4/1994 | Vinal .......................... 365/203 |
| 5,376,835 A | 12/1994 | Van Buskirk et al. |
| 5,508,649 A | 4/1996 | Shay |
| 5,519,347 A | 5/1996 | Kim |
| 5,610,542 A | 3/1997 | Kang et al. |
| 5,617,062 A * | 4/1997 | O'Shaughnessy et al. .. 331/111 |

* cited by examiner

Primary Examiner—Thong Q. Le
(74) Attorney, Agent, or Firm—Heller Ehrman White and McAuliffe LLP

(57) ABSTRACT

A reset signal generating circuit and a nonvolatile ferroelectric memory device using the same are disclosed. The reset signal generating circuit generates a reset signal by using a self-bias circuit regardless of a slope time of a power voltage only when the power voltage rises beyond a predetermined voltage. As a result, the reset signal generating circuit may generate a stable reset signal having excellent operation characteristics at short intervals even when the supply of the power source is repeatedly intercepted. Additionally, the reset signal generation circuit may stabilize generation of control signals for controlling a nonvolatile FeRAM, thereby improving the operation characteristics of the memory device.

19 Claims, 18 Drawing Sheets

RESET CIRCUIT AND FERAM USING THE SAME

BACKGROUND OF THE INVENTION

1. Field of the Invention

The present invention generally relates to a nonvolatile ferroelectric memory device, and more specifically, to a reset circuit for generating a reset signal by using a self-bias circuit regardless of a power-up slope only when a power voltage is beyond a predetermined voltage, and a nonvolatile ferroelectric memory device using the same.

2. Description of the Prior Art

Generally, a FeRAM has the same data processing speed as a dynamic random access memory (DRAM) and retains data even when power is off. For this characteristic, the FeRAM has been highly attracted as a next generation memory device.

The FeRAM has structures similar to those of a DRAM, and uses ferroelectric material as a component of a capacitor. The FeRAM uses a characteristic of high residual polarization in ferroelectric material.

Due to the high residual polarization, data remains unerased even if the electric field is removed.

FIG. 1 illustrates a hysteresis loop of a general ferroelectric.

As shown in FIG. 1, polarization induced by the electric field is maintained at a certain amount (i.e., "d" and "a" states) due to the presence of residual polarization (or spontaneous polarization), even if the electric field is removed.

A FeRAM cell may be used as a memory device by corresponding the "d" and "a" states to 1 and 0, respectively.

FIG. 2 illustrates a unit cell of a conventional FeRAM device.

As shown in FIG. 2, the unit cell of the conventional FeRAM device includes a bitline B/L formed in one direction, a wordline W/L formed to cross the bitline B/L and a plateline P/L arranged parallel to the wordline and spaced at a predetermined interval from the wordline W/L. The unit cell also includes a NMOS transistor having a gate connected to the wordline W/L and a source connected to the bitline B/L, and a ferroelectric capacitor FC1 connected between a drain of the NMOS transistor and the plateline P/L.

The data input/output operation of the conventional FeRAM device is now described as follows.

FIG. 3A is a timing chart illustrating a write mode operation of a general FeRAM device, and FIG. 3B is a timing chart illustrating a read mode operation of a general FeRAM device.

Referring to FIG. 3A, if an externally applied chip enable signal CSBPAD is activated from 'high' to 'low', a write enable signal is transited from 'high' to 'low', and the writing mode starts.

Subsequently, if an operation of decoding addresses starts in the write mode, the corresponding wordline W/L transits from 'low' to 'high' to select the cell.

During the interval wherein the wordline W/L maintains a 'high' state, a 'high' signal of a predetermined period and a 'low' signal of a predetermined period are alternatively applied to a corresponding plateline P/L. In order to write binary logic values '1' or '0' in the selected cell, 'high' or 'low' signals synchronous with respect to the write enable signal WEBPAD are applied to a corresponding bitline B/L.

As shown in the following Table 1, during the period wherein a 'high' signal is applied to a wordline W/L, if a 'high' signal is applied to the bitline B/L and a 'low' signal is applied to the plateline P/L, a logic value '1' is written in the ferroelectric capacitor FC1. If a 'low' signal is applied to the bitline B/L and a 'high' signal is applied to the plateline P/L, a logic value '0' is written in the ferroelectric capacitor FC1.

TABLE 1

| W/L:H | | P/L | |
|---|---|---|---|
| | | H | L |
| B/L | H | X | 1 |
| | L | 0 | X |

Referring to FIG. 3B, If an externally applied chip enable signal CSBPAD is activated from 'high' to 'low', all of the bitlines become equipotential to low voltage by an equalizer signal before a corresponding wordline is selected.

Then, after each bitline becomes inactive, an address is decoded. A wordline corresponding to the decoded address is transited from the low to the high level, to enable a selected cell.

A 'high' signal is applied to a corresponding plateline of the selected cell to destroy a data Qs corresponding to a logic value '1' stored in the ferroelectric memory cell. If a logic value '0' is stored in the ferroelectric memory cell, its corresponding data Qns is not destroyed.

The destroyed data or the non-destroyed data is outputted to bitlines, according to the above-described hysteresis loop characteristics, so that a sense amplifier senses logic values '1' or '0'.

In other words, as shown in the hysteresis loop of FIG. 1, the state moves from the 'd' to 'f' when the data is destroyed while the state moves from 'a' to 'f' when the data is not destroyed. The logic value '1' is output in case the data is destroyed, while the logic value '0' is output in case the data is not destroyed.

After the sense amplifier amplifies the data, the data should be recovered into the original data. Accordingly, the plateline P/L becomes inactive from 'high' to 'low' during the interval where the 'high' signal is applied to the corresponding wordline W/L.

In a system using a nonvolatile FeRAM as a memory device, a system controller outputs a chip enable signal CSBPAD into a FeRAM chip. A memory device in the memory chip such as a FeRAM chip generates a chip internal control signal CE for operating a memory cell of a chip according to the chip enable signal CSBPAD. Data is read or written according to the chip internal control signal CE. The data is transferred to the system controller via a data bus.

The system is re-setup by reading data stored in a code register, when a power is applied to the nonvolatile FeRAM. The code register reading operation is performed using a power-on reset signal.

A conventional power-on reset signal generating circuit is configured to have much influence on generation of a reset signal by a power-on slope of a voltage. As a result, the reset signal is generated even in a low power voltage if the power-on slope becomes longer.

FIG. 4 is a circuit diagram showing a conventional power-on reset circuit.

The conventional power-on reset circuit of FIG. 4 comprises a PMOS transistor T1 and a NMOS capacitor T2 connected in series between a power voltage VCC and a ground voltage VSS and a gate of the PMOS transistor T1 is connected to the ground voltage VSS. The power-on reset circuit further comprises a first inverter INV1, a second inverter INV2, a PMOS transistor T3 and a third inverter INV3. The first inverter INV1 inverts an output voltage of the PMOS transistor T1. The second inverter INV2 inverts an output signal of the first inverter INV1. The PMOS transistor T3 is controlled by an output signal of the second inverter INV2, and connected between the power voltage VCC and an output terminal of the first inverter INV1. The third inverter INV3 inverts an output signal of the second inverter INV2, and outputs a reset signal.

Levels of output voltages in the power-on reset circuit are determined by a RC delay time between the PMOS transistor T1 serving as a current source and the NMOS transistor T2 serving as a capacitor device.

The power-up operation should be performed in a predetermined time for the stable operation of the memory chip. However, if the power-up time is over the predetermined time by a certain factor, data stored in the code register is destroyed.

FIGS. 5 and 6 are waveform diagrams showing the operation of the power-on reset circuit of FIG. 4, respectively, when the power voltage increases with a fast gradient and when the power voltage increases with a slow gradient.

As shown in FIG. 5, when the power voltage increases rapidly from the VSS level(ground) to the VCC level with the fast gradient, a reset signal is generated at a voltage higher than a predetermined voltage level (threshold voltage).

Referring to FIG. 6, when the power voltage increases slowly from the VSS level to the VCC level with the slow gradient, the NMOS capacitor T2 is precharged for more time than the case of FIG. 5, thereby rapidly increasing a sensing level of the NMOS capacitor T2. As a result, a reset signal is generated at a voltage lower than the threshold voltage.

As described above, in the conventional power-on reset circuit, the reset signal may be generated at a voltage lower than a normal voltage because of unstable generation of the power-on reset signal according to variations of the power. If the code register is operated at a low voltage, data stored in the code register is mis-read or restored in an insufficient state, thereby causing failure in the code register.

Accordingly, a reset circuit configured to generate a power-on reset signal beyond a predetermined voltage in any power-on slope is required.

SUMMARY OF THE INVENTION

Accordingly, it is an object of the present invention to a reset circuit for stably generating a reset signal when a power voltage is beyond a predetermined level regardless of a power-on slope of a power voltage.

There is provided a reset signal generating circuit comprising: a power detector for maintaining the size of an applied voltage for a predetermined period; a threshold voltage controller for outputting a voltage by regulating the level of a power voltage for generating a reset signal depending on variations of the power voltage and a bias voltage; a feedback controller for pulling down an output voltage of the power detector when the power voltage reaches a predetermined level depending on an output voltage of the threshold voltage controller; a pull-up controller for pulling up an output voltage of the power detector and outputting an output voltage variation of the power detector as the reset signal; and a self-bias unit for outputting the bias voltage and regulating the amount of a current supplied from the threshold voltage controller to the feedback controller depending on variations of the power voltage.

There is also provided a nonvolatile ferroelectric memory device using the above-described reset signal generating circuit, comprising: a reset generator for outputting a reset signal only when the power voltage is beyond a predetermined level regardless of a power-up slope; a reset transition detector for detecting a transition point of the reset signal and outputting a reset signal transition detecting signal; an address latch for latching an address inputted through an address pad in response to a chip enable signal and an address transition control signal; an address transition detector for detecting a transition point of an address outputted from the address latch and outputting an address transition detecting signal; a chip enable transition detector for detecting transition points of the chip enable signal and the reset signal transition detecting signal and outputting a chip enable transition detecting signal; and a synthesizer for synthesizing the address transition detecting signal and the chip enable signal transition detecting signal and outputting the synthesized signal.

DETAILED DESCRIPTION OF THE PREFERRED EMBODIMENTS

Figure 1:
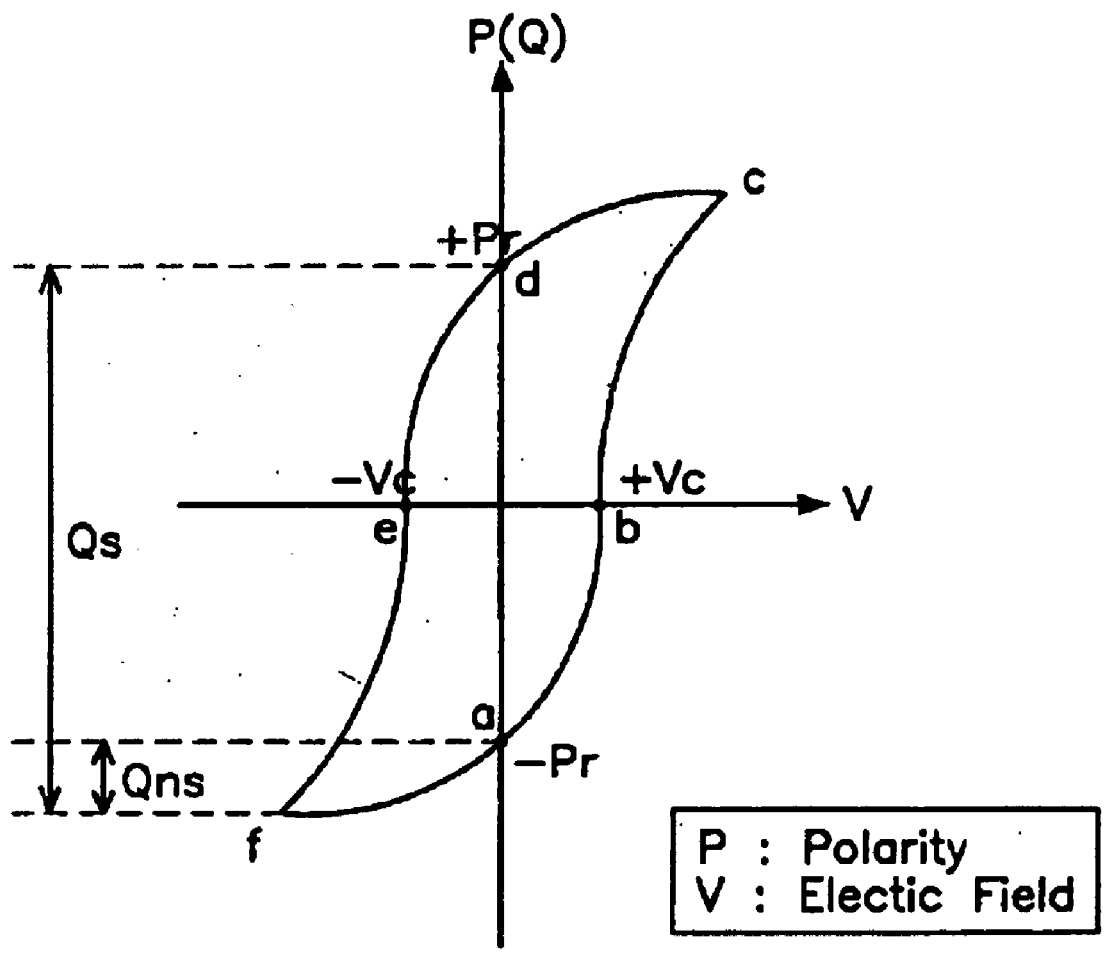
FIG. 1 is a characteristic curve showing a hysteresis loop of a general ferroelectric material.
Figure 2:
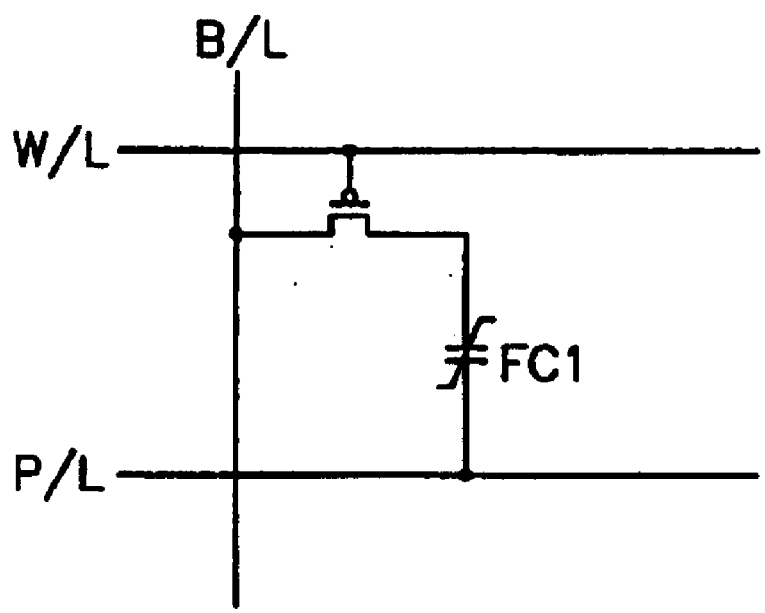
FIG. 2 is a structural diagram showing a unit cell in a general FeRAM device.
Figure 3A:
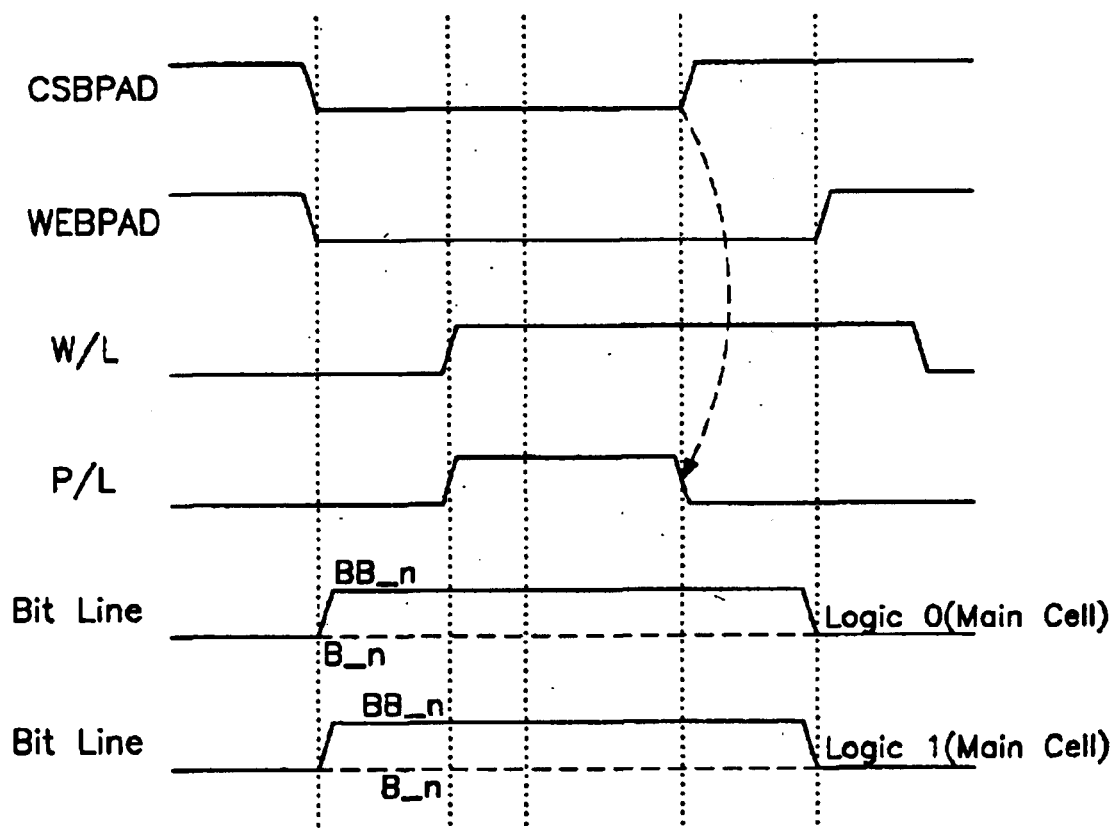
FIG. 3a is a timing diagram showing a write mode operation of a general FeRAM device.
Figure 3B:
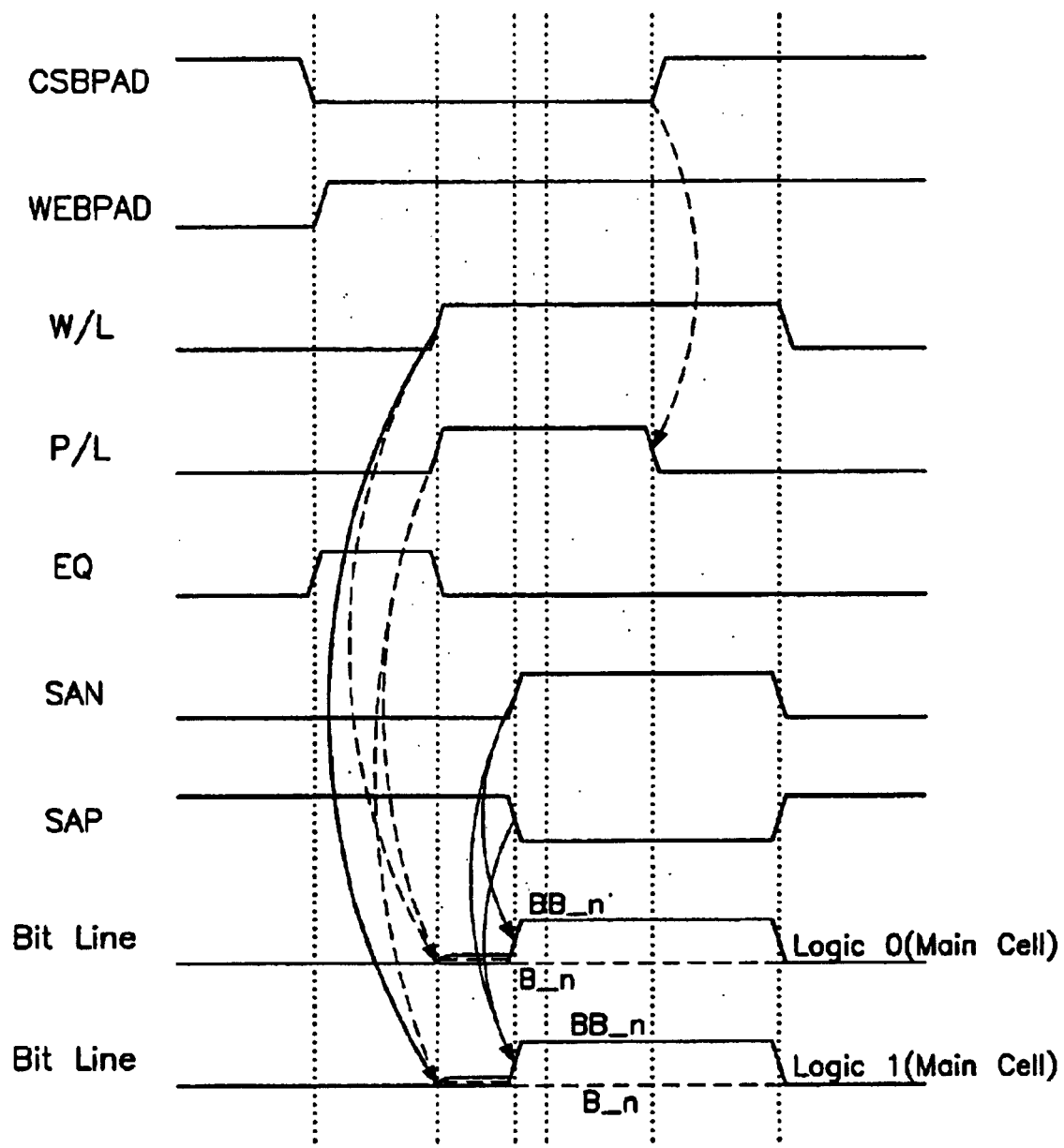
FIG. 3b is a timing diagram showing a read mode operation of a general FeRAM device.
Figure 4:
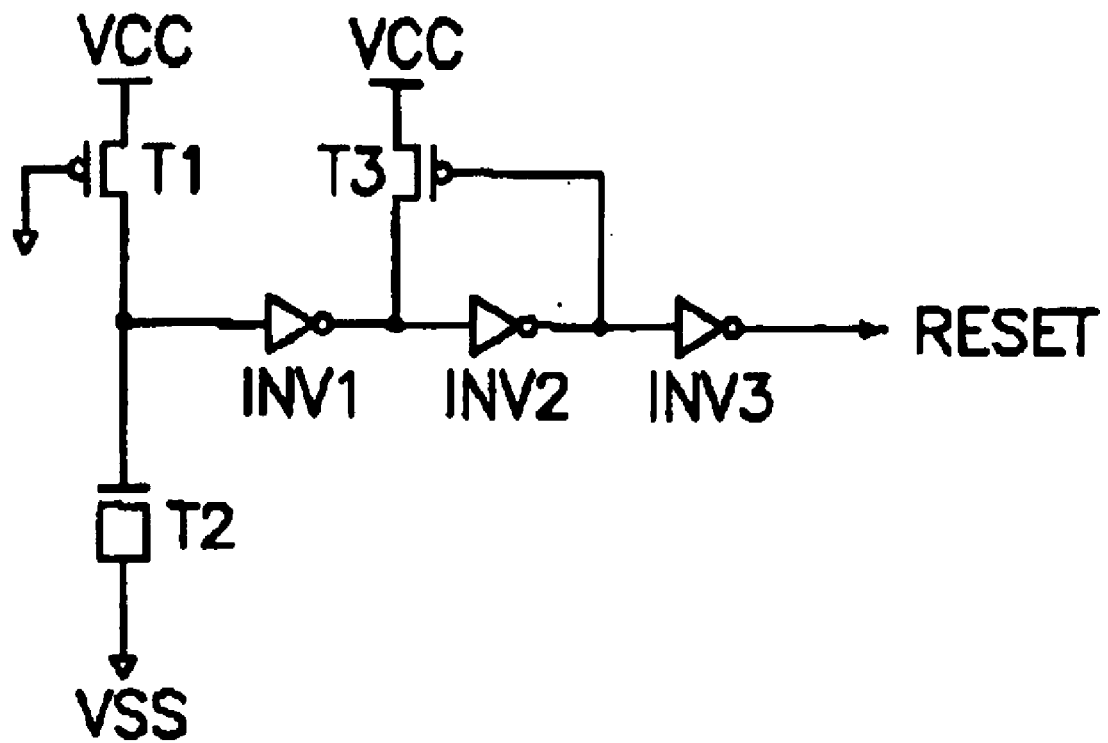
FIG. 4 is a circuit diagram showing a conventional power-on reset circuit.
Figure 5:
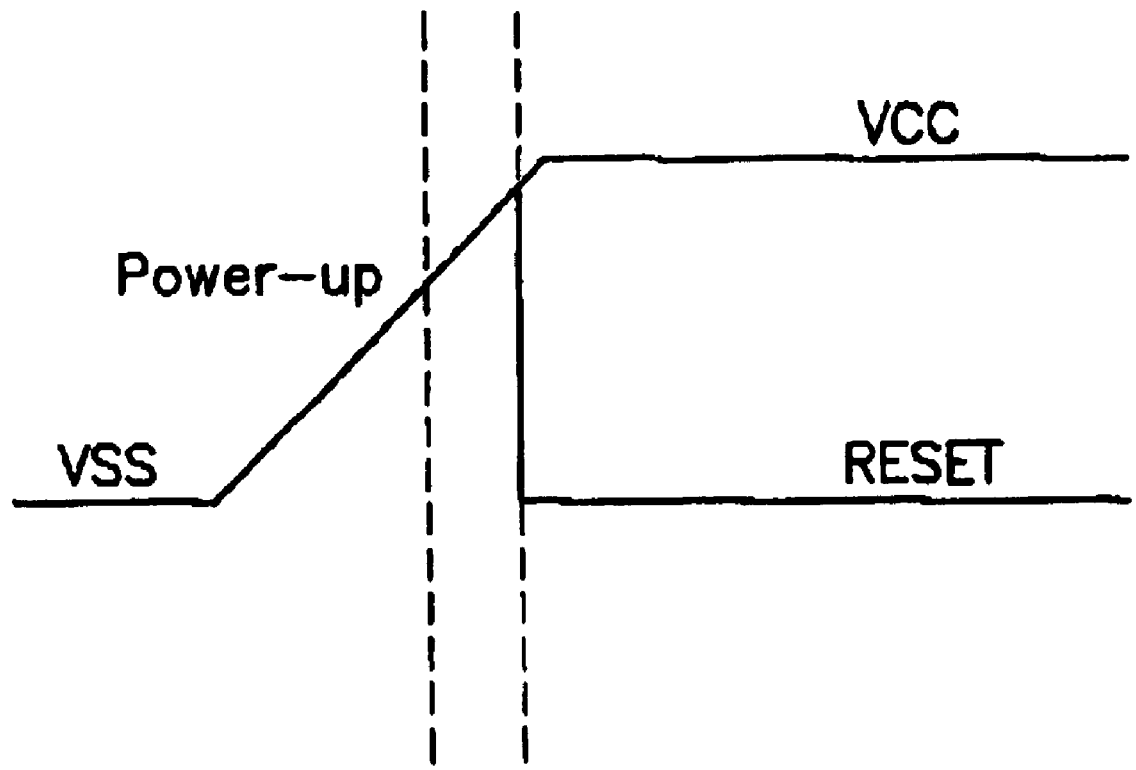
FIGS. 5 and 6 are waveform diagrams showing the operation of the power-on reset circuit of FIG. 4.
Figure 6:
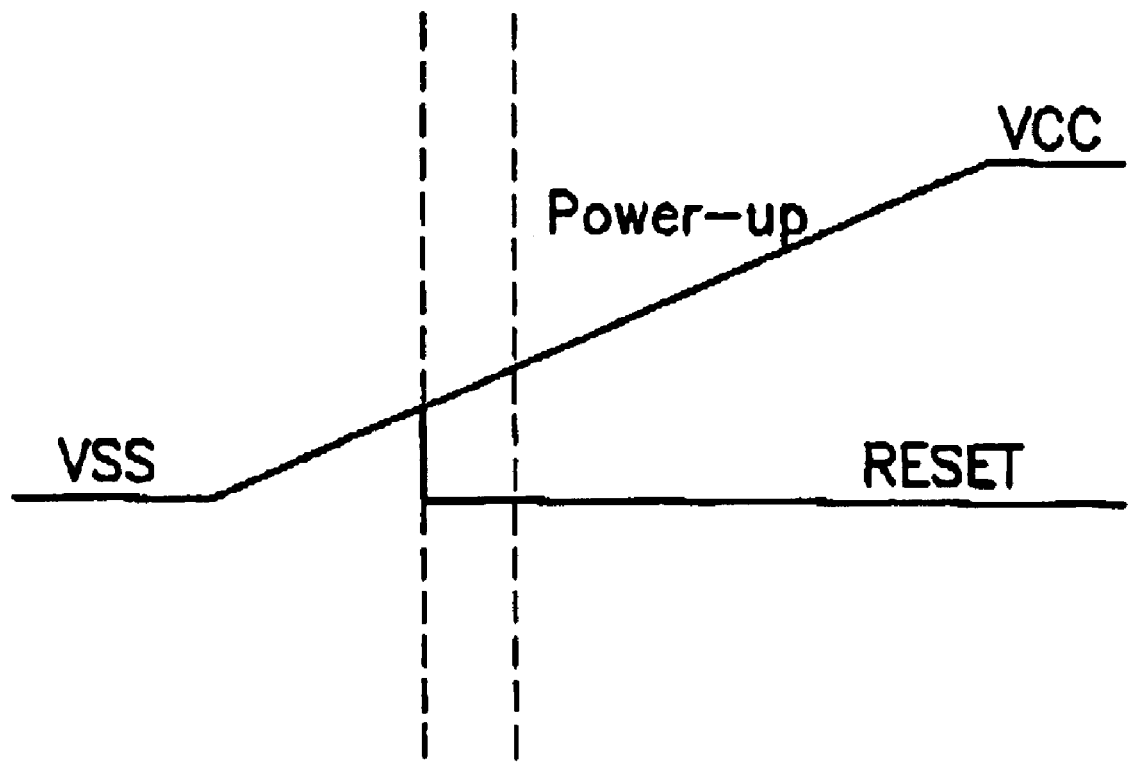
Figure 7:
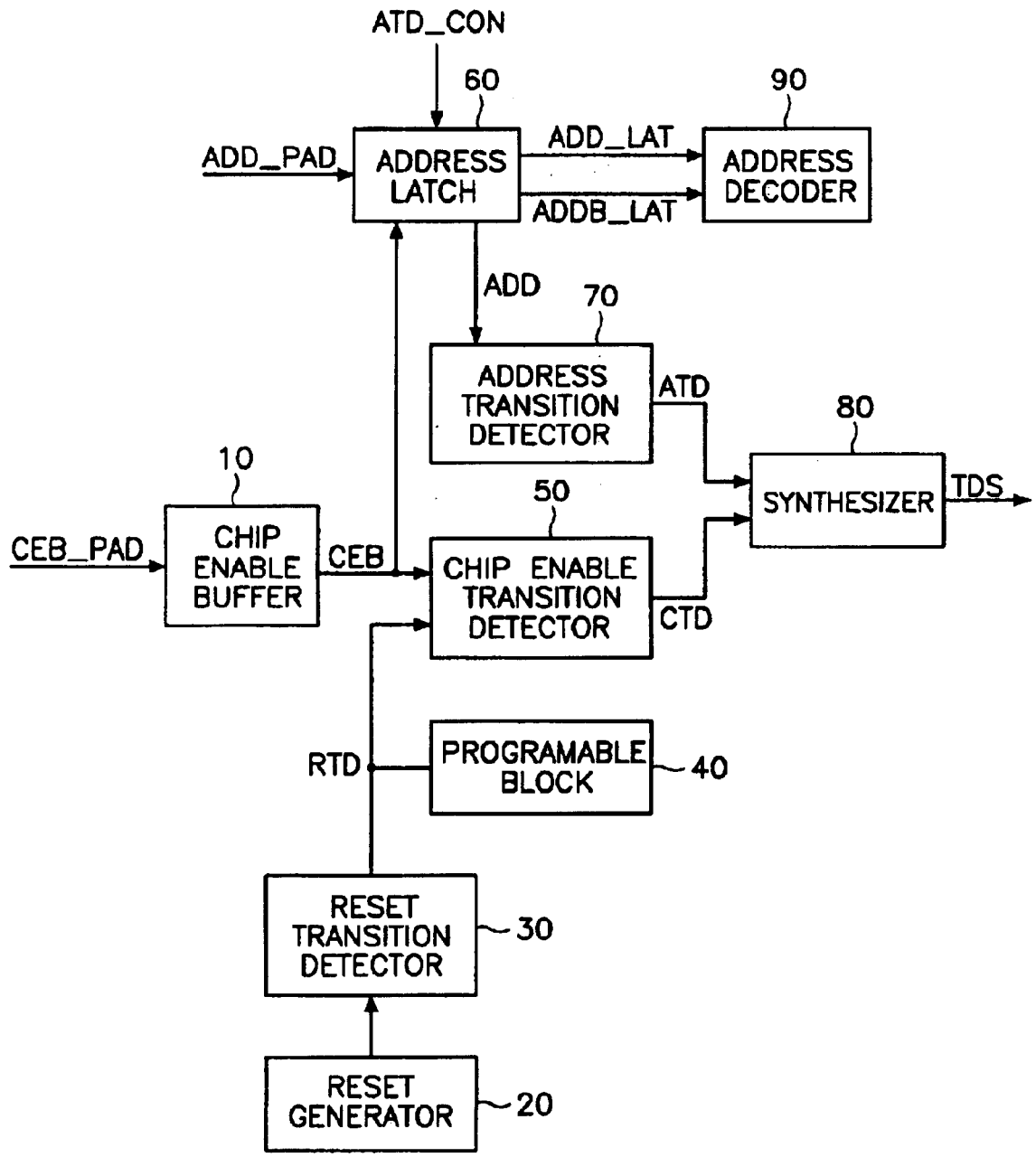
FIG. 7 is a structural diagram showing a nonvolatile FeRAM using a reset signal generating circuit according to the present invention.

FIG. 7 is a structural diagram showing a reset signal generating circuit for generating a chip control signal in a nonvolatile FeRAM according to the present invention. The relations of transition detecting signals RTD, CTD, ATD and TDS are shown.

The nonvolatile FeRAM of FIG. 7 comprises a chip enable buffer 10, a reset signal generator 20, a reset signal transition detector 30, a programmable circuit block 40, a chip enable signal transition detector 50, an address latch 60, an address transition detector 70 and a synthesizer 80.

The chip enable signal buffer 10 temporarily stores a signal CEB_PAD inputted through a chip enable pad, and outputs a chip enable signal CEB. Here, the phase of the outputted chip enable signal CEB is the same with that of a chip activation regulating signal CEB_PAD.

The reset signal generator 20 generates a reset signal only when a power voltage level becomes at a predetermined level regardless of a power-up slope time of the power voltage.

Figure 9:
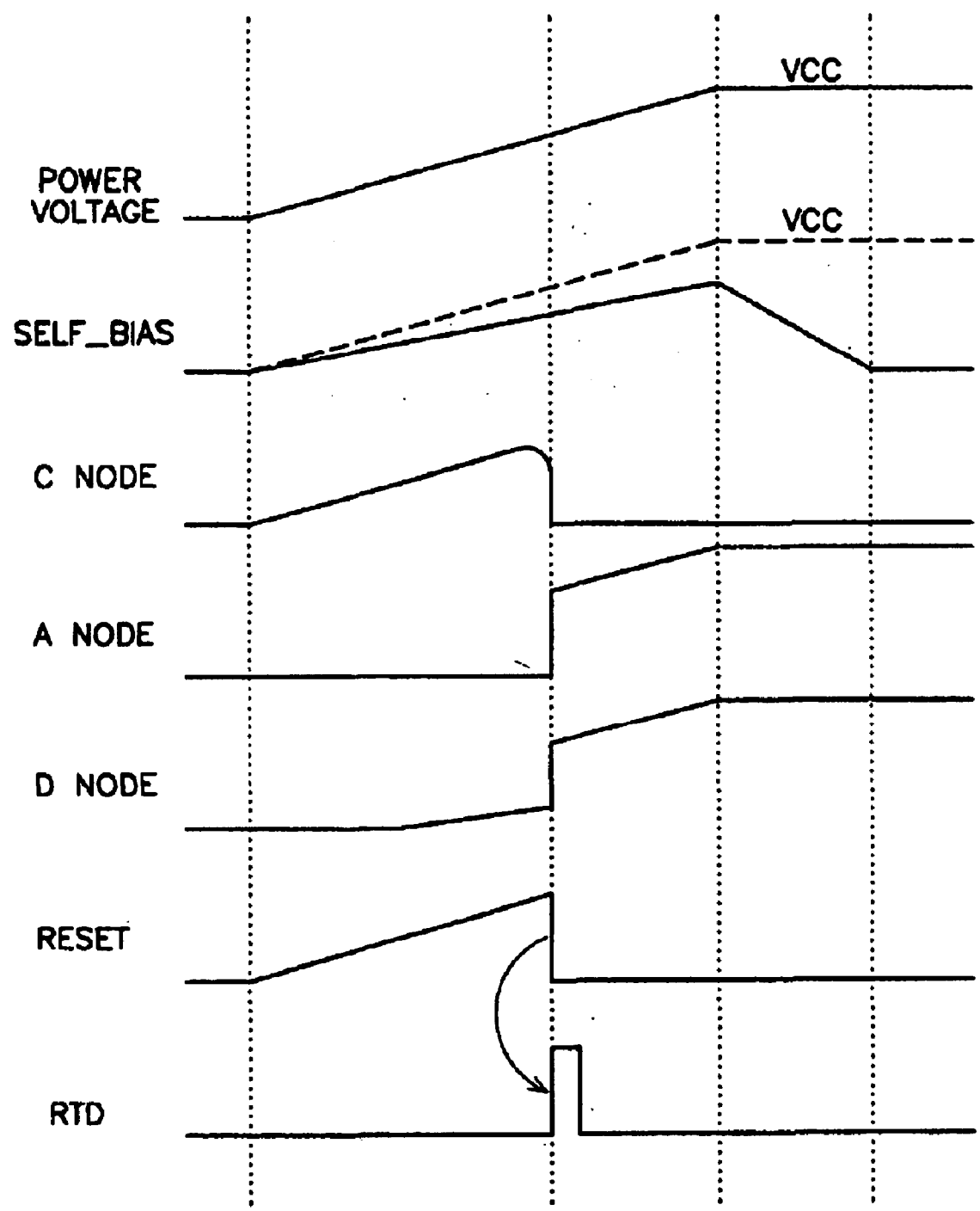
FIG. 9 is a waveform diagram showing the operation of the reset signal generating circuit of FIG. 8.

The reset signal transition detector 30 detects a point when the reset signal RESET inputted from the reset signal generator 20 is transited, and generates a reset signal transition detecting signal RTD when the reset operation is started as shown in FIG. 9.

The programmable circuit block 40 comprises nonvolatile programmable code registers and the inputs/outputs can be changed externally. The programmable circuit block 40 operates in response to the reset signal transition detecting signal RTD.

The chip enable signal transition detector 50 receives the chip enable signal CEB outputted from the chip enable signal buffer 10 and the reset signal transition detecting signal RTD outputted from the reset signal transition detector 30, and generates a chip enable transition detecting signal CTD when one of the two signals is transited from a high level to a low level.

The address latch 60 receives an address ADD_PAD inputted through an address pad, and outputs an address ADD and latched addresses ADD_LAT and ADDB_LAT in response to the chip enable signal CEB and an address transition control signal ATD_CON.

The address transition detector 70 detects a transition point of the address ADD which is the output signal of the address latch 60, and outputs an address transition detecting signal ATD.

The synthesizer 80 synthesizes the chip enable transition signal CTD outputted from the chip enable signal transition detector 50 and the address transition detecting signal ATD outputted from the address transition detector 70, thereby outputting a transition detecting signal TDS for driving a wordline WL and a plateline PL of the memory cell.

Figure 8:
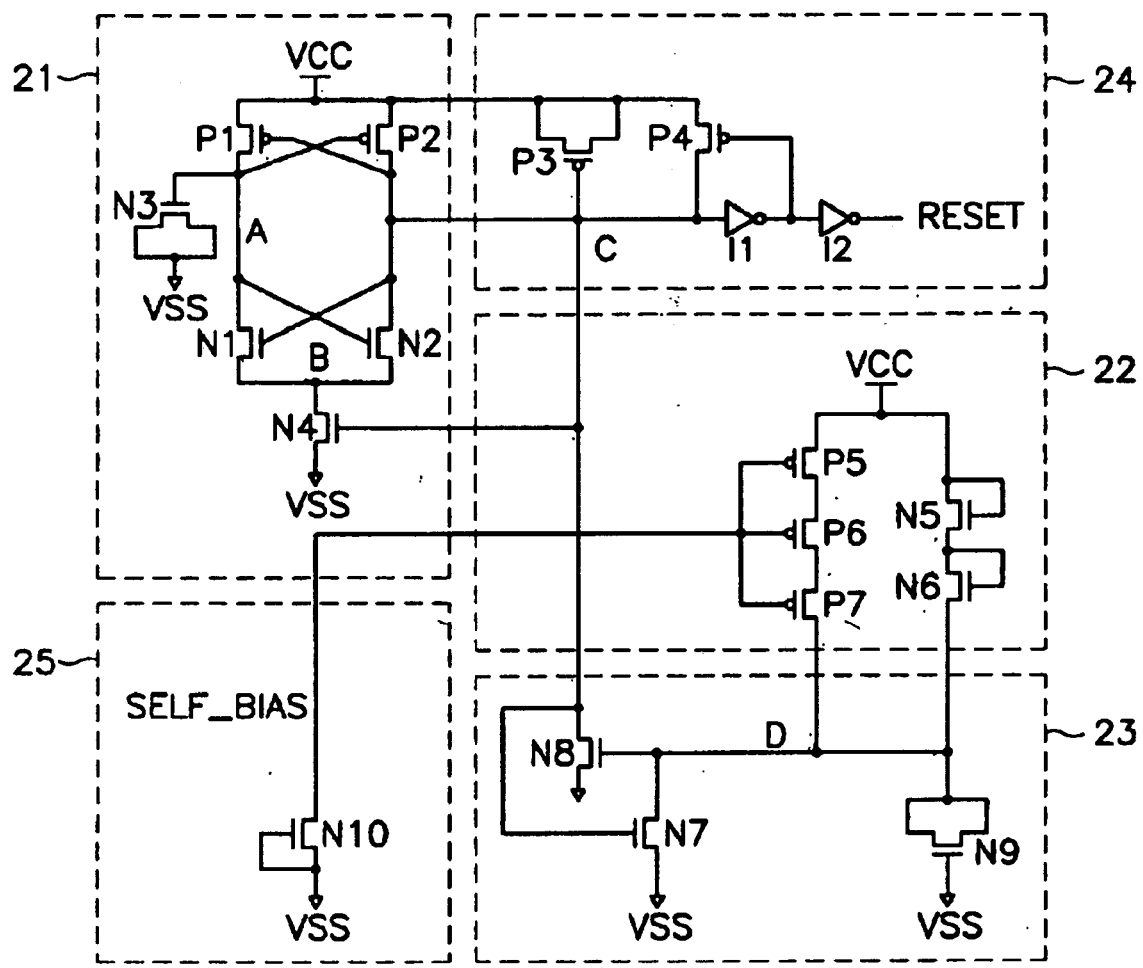
FIG. 8 is a circuit diagram showing a reset signal generating circuit according to a first example of the present invention.

FIG. 8 is a circuit diagram showing a reset signal generating circuit according to a first example of the present invention.

The reset signal generating circuit of FIG. 8 comprises a power detector 21, a threshold voltage controller 22, a feedback controller 23, a pull-up controller 24 and a self-bias unit 25.

The power detector 21 comprises PMOS transistors P1 and P2, NMOS transistors N1, N2, N3 and N4. The PMOS transistor P1 and the NMOS transistor N1 connected in series between a power voltage VCC and a node B have each gate connected to a node C. The PMOS transistor P2 and the NMOS transistor N2 connected in series between the power voltage VCC and the node B have each gate connected to a node A. The NMOS transistor N3 has a drain and a source connected in common to a ground voltage VSS, and a gate connected to the node A. The NMOS transistor N4 connected between the node B and the ground voltage VSS has a gate connected to a node C.

The threshold voltage controller 22 comprises PMOS transistors P5, P6 and P7, and NMOS transistors N5 and N6. The PMOS transistors P5, P6 and P7, connected in series between a power voltage VCC and a node D, have each gate connected in common. The NMOS transistors N5 and N6, connected in series between the power voltage VCC and the node D, have each gate connected in common to each drain.

The NMOS transistors N5 and N6 supplies a current to the node D in proportion to increase of the power voltage VCC. The NMOS transistors N5 and N6 regulate the level of a voltage where a reset signal by forming a voltage ranging of VCC-2Vtn (Vtn: threshold voltage of N5 and N6) in the node D. The NMOS transistors N5 and N6 serve as a voltage driver for transiting an output voltage of the power detector 21 to a low level when the power voltage VCC increases to a predetermined level. Here, a voltage of the node D does not rise to the level of the power voltage VCC only by the current supplied by the NMOS transistors N5 and N6. In other words, the voltage of the node D rises to VCC-2Vtn by the NMOS transistors N5 and N6. However, the voltage of the node D is required to rise to the level of the power voltage VCC for stabilization of the reset signal. The PMOS transistors P5, P6 and P7 serve as a voltage pull-up unit for pulling up the voltage of the node D to the level of the power voltage VCC. However, the generation of the reset signal RESET may be unstable by leakage currents of the PMOS transistors P5, P6 and P7.

In order not to generate a leakage current at an initial stage of the operation, a bias voltage is applied to gates of the PMOS transistors P5, P6 and P7. This function will be explained later for further details.

The feedback controller 23 comprises NMOS transistors N7 and N8, and a MOS capacitor N9. The NMOs transistor N7 connected between the node D and a ground voltage VSS has a gate connected to the node C. The NMOS transistor N8 connected between the node C and the ground voltage VSS has a gate connected to the node D. The MOS capacitor N9 has a drain and a source connected in common to the node D, and a gate connected to the ground voltage VSS.

The pull-up controller 24 comprises PMOS transistors P3 and P4, and inverters I1 and I2. The PMOS transistor P3 has a drain and a source connected in common to the power voltage VCC, and a gate connected to the node C. The inverter I1 inverts a signal of the node C. The PMOS transistor P4 connected between the power voltage VCC and the node C has a gate connected to an output terminal of the inverter I1. The inverter I2 inverts an output signal of the inverter I1 and outputs the signal as a reset signal.

The self-bias unit 25 comprises a NMOS transistor N10. The NMOS transistor N10 connected between a ground voltage VSS and the gate connected in common of the PMOS transistors P5, P6 and P7 of the threshold voltage controller 22 has a gate connected in common to a source. The self-bias unit 25 applies a predetermined bias voltage (threshold voltage of the NMOS transistor N10) to the gate of the PMOS transistors P5, P6 and P7 at an initial sate of the operation of the reset signal generator 20.

In the reset signal generating circuit of the present invention, a sub-leakage current by the PMOS transistors P5, P6 and P7 of the threshold voltage controller 22 is not supplied to the node D at an initial stage of the operation. As a result, a reset signal is not generated if the power voltage VCC does not reach a predetermined level.

FIG. 9 is a waveform diagram showing the operation of the reset signal generating circuit of FIG. 8. The operation of the reset signal generating circuit of FIG. 8 is explained in more detail referring to FIG. 9.

The node A is fixed at a low level by the NMOS transistor N3 at an initial stage of the operation when the power voltage VCC is turned on, and its level rises from a low voltage to a normal voltage. As the power voltage VCC increases, the current inflow into the node c by the PMOS transistor P2 increases. As a result, the voltage of the node C is increased in response to the power voltage, and maintained at a high level.

Until the voltage of the node C becomes beyond a predetermined level, the NMOS transistor N4, a latch enable gate, is turned on, and the node A and the node C, which are both ends of a latch, are maintained at a low level and at a high level, respectively, due to the structure of the latch circuit. The NMOS transistor N7 is turned on by the high level of the node C, and the node D becomes stably at a low level which is a ground level. If the node D becomes at a low level, the NMOS transistor N8 for controlling a pull-down operation of the node C is maintained at an off state.

However, if the power voltage VCC is slowly increased, the level of the current flowed through the PMOS transistors P5, P6 and P7 and the NMOS transistors N5 and N6 of the threshold voltage controller 22 into the node D is also increased. The voltage of the node D is initially maintained at a low level by the NMOS transistors N9 and N7. However, as the power voltage VCC is slowly increased, the voltage level of the node D is determined by a ratio of the current flowed through the PMOS transistors P5, P6 and P7 and the NMOS transistors N5 and N6 and a current sunk through the NMOS transistor N7.

If the voltage of the node D is beyond a predetermined level, the NMOS transistor N8 is turned on. Then, the current sunk through the NMOS transistor N8 becomes larger than a current supplied to the node C by the PMOS transistors P2 and P4, and the node C is transited to a low level. Here, the NMOS transistor N4 is changed to an off state. If the node C is transited to the low level, the node A is pulled up to a high level. The PMOS transistor P2 is turned off, and a current for pulling up the node C is intercepted. If the node C becomes at a low level, an output of the inverter I1 becomes at a high level, thereby intercepting a current supply by the PMOS transistor P4. As a result, the node C is stably maintained at the low level.

If the node C becomes at the low level, the NMOS transistor N7 of the feedback controller 23 is changed into an off state. If the current sinkage in the node D by the NMOS transistor N7 is intercepted, the node D may rise to the level of the power voltage VCC by the current supply by the PMOS transistors P5, P6 and P7. If the voltage level of the node D rises, a current driving ability of the NMOS transistor N8 is further improved. As a result, the node C is stably fed-back to be at the low level.

The node D is maintained at a low level by the NMOS capacitor N9 for load before level of the power voltage starts to rise in order to turn off the NMOS transistor N8 at the initial stage of the operation.

Generally, when a gate of a PMOS transistor has a lower voltage than a source of the PMOS transistor, a sub leakage current from the source to a drain of the PMOS transistor is frequently generated.

If the power voltage VCC starts to rise, and the common source of the PMOS transistors P5, P6 and P7 in the threshold voltage controller 22 has a higher voltage than the gate, a sub leakage current is generated in the PMOS transistors P5, P6 and P7. If a current supplied to the node D by the sub leakage current becomes larger than a current supplied to the node C by PMOS transistor P2, the voltage of the node D may be instantly higher than that of the node C at the initial stage of the operation.

Then, the NMOS transistor N8 is turned on, and the node C becomes at the low level. This state is continuously maintained. As a result, a reset signal RESET is generated when the power voltage VCC is below a predetermined level.

Here, in order not to generate a reset signal at a low level of the power voltage VCC, the generation of the sub leakage current by the PMOS transistors P5, P6 and P7 resulting from the increase of the power voltage VCC should be inhibited.

For this inhibition, a bias voltage is applied to the common gate of the PMOS transistors P5, P6 and P7. The bias voltage rises together at a predetermined rate as the power voltage VCC rises.

In the self-bias unit 25, the NMOS transistor N10 is connected to the common gate of the PMOS transistors P5, P6 and P7. In the initial stage of the operation, a threshold voltage of the NMOS transistor N10 is applied to the gate of the PMOS transistors P5, P6 and P7.

As a result, the leakage current of the PMOS transistors P5, P6 and P7 is inhibited although the power voltage VCC rises at the initial stage of the operation. When the power voltage VCC rises to a predetermined level, the current supply into the node D by the NMOS transistors N5 and N6 becomes larger than the current sinkage by the NMOS transistor N7. If the voltage of the node D reaches a threshold voltage of the NMOS transistor N8, the NMOS transistor N8 is turned off.

A voltage of an output terminal SELF_BIAS of the self-bias unit 25 is coupled by a gate capacitance of the PMOS transistors P5, P6 and P7 when the power voltage VCC rises, and the voltage rises following the power voltage VCC, as shown in FIG. 9. As a result, the current supply into the node D by the leakage current of the PMOS transistors P5, P6 and P7, and the voltage increase are stably intercepted.

The voltage of the node C rises following the power voltage VCC until the voltage of the node D turns on the NMOS transistor N8, and it is transited to a low level when the power voltage VCC becomes at a predetermined level.

Here, the voltage increase rate of the output terminal SELF_BIAS is determined by a ratio of a total capacitance CST of the self-bias unit 25 and a coupling capacitance CSC of the PMOS transistors P5, P6 and P7.

The voltage increase rate of the output terminal SELF_BIAS of FIG. 9 is represented by $CSC/(CSC+CST) \times VCC$. If the total capacitance CST of the self-bias unit 25 and the coupling capacitance CSC of the PMOS transistors P5, P6 and P7 are regulated, the voltage increase rate of the output terminal SELF_BIAS can be also controlled.

When the increase of the power voltage VCC is completed, the voltage of the output terminal SELF_BIAS is slowly decreased by a leakage current of the output terminal SELF_BIAS of the self-bias unit 25. After a predetermined time, the output terminal SELF_BIAS of the self-bias unit 25 becomes at the ground voltage VSS.

After the increase of the power voltage VCC is completed, the voltage of the output terminal SELF_BIAS of the self-bias unit 25 is transited to the level of the ground voltage VSS. As a result, the PMOS transistors P5, P6 and P7 are restored to the on-state, and the node D rises to the level of the power voltage VCC.

The voltage of the node C is outputted as the reset signal RESET through the inverters I1 and I2. The reset signal RESET is applied to the reset signal transition detector 30.

Figure 10:
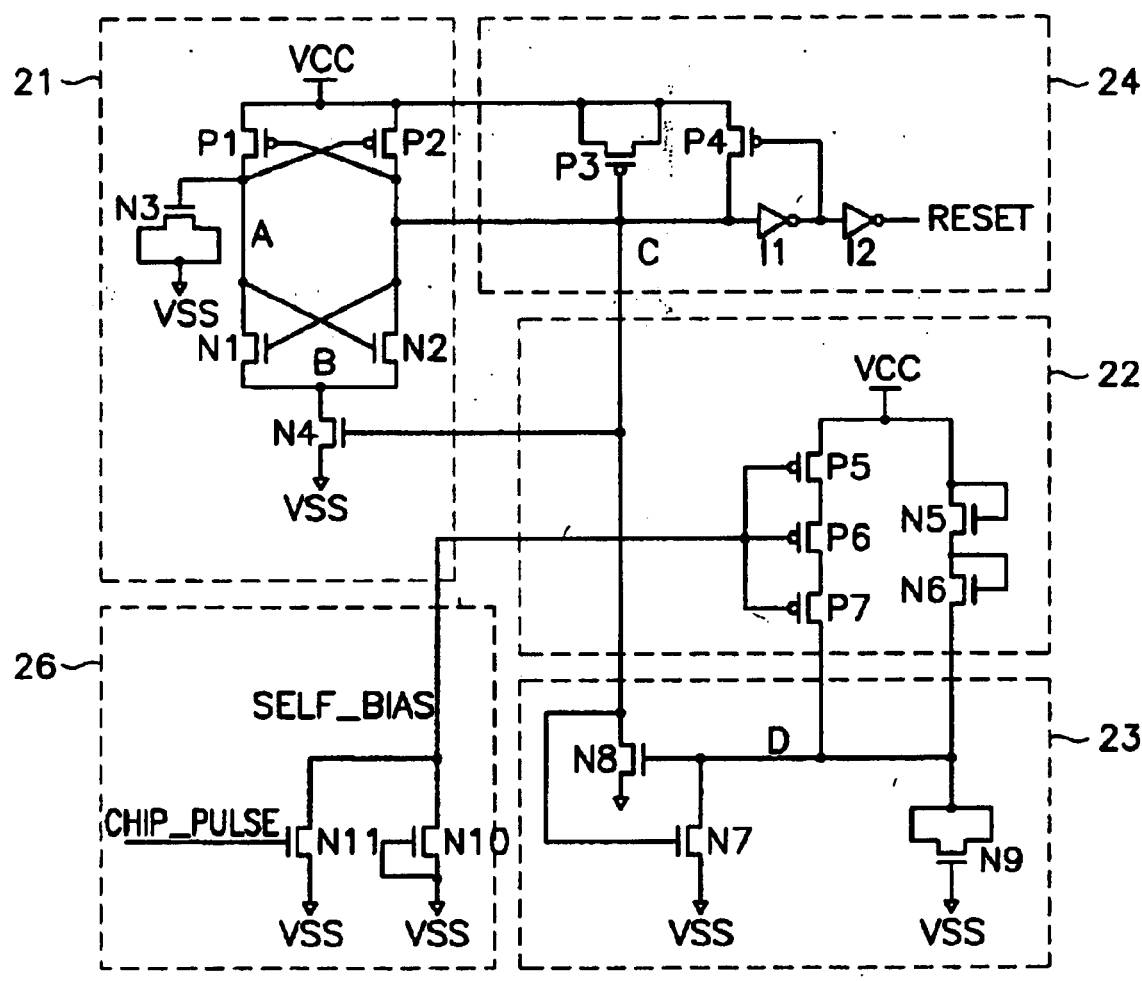
FIG. 10 is a circuit diagram showing a reset signal generating circuit according to a second example of the present invention.
Figure 11:
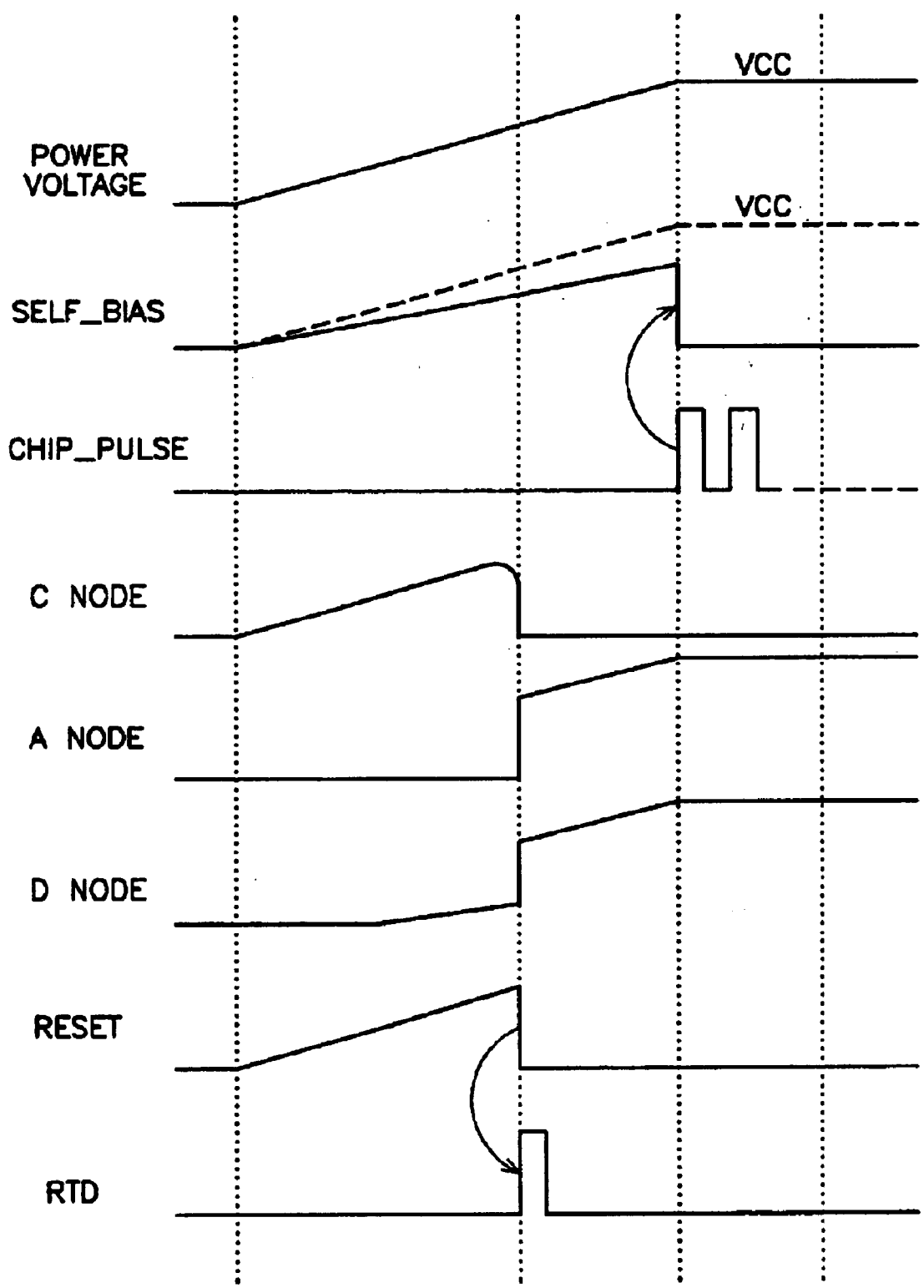
FIG. 11 is a waveform diagram showing the operation of the reset signal generating circuit of FIG. 10.

FIG. 10 is a circuit diagram showing a reset signal generating circuit according to a second example of the present invention. FIG. 11 is a waveform diagram showing the operation of the reset signal generating circuit of FIG. 10.

FIG. 10 is different from FIG. 8 in the structure of the self-bias unit 26.

The self-bias unit 26 further comprises a NMOS transistor N11 connected in parallel to the NMOS transistor N10 and having a gate to receive an external control signal CHIP_PULSE. The self-bias unit 26 is configured to become at a low level earlier than the self-bias unit 25 by increasing the pull-down speed of the output terminal SELF_BIAS in response to the control signal CHIP_PULSE.

Figure 12:
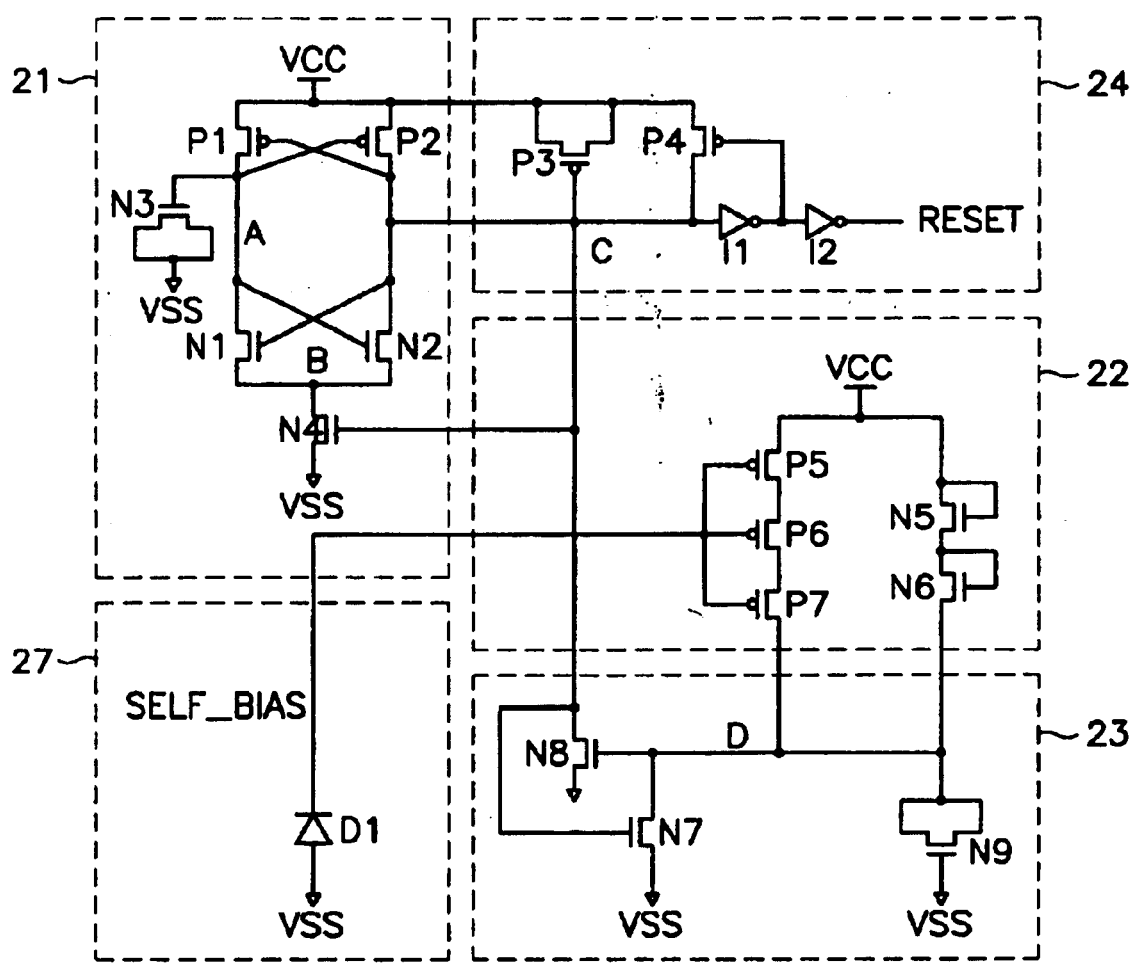
FIG. 12 is a circuit diagram showing a reset signal generating circuit according to a third example of the present invention.
Figure 13:
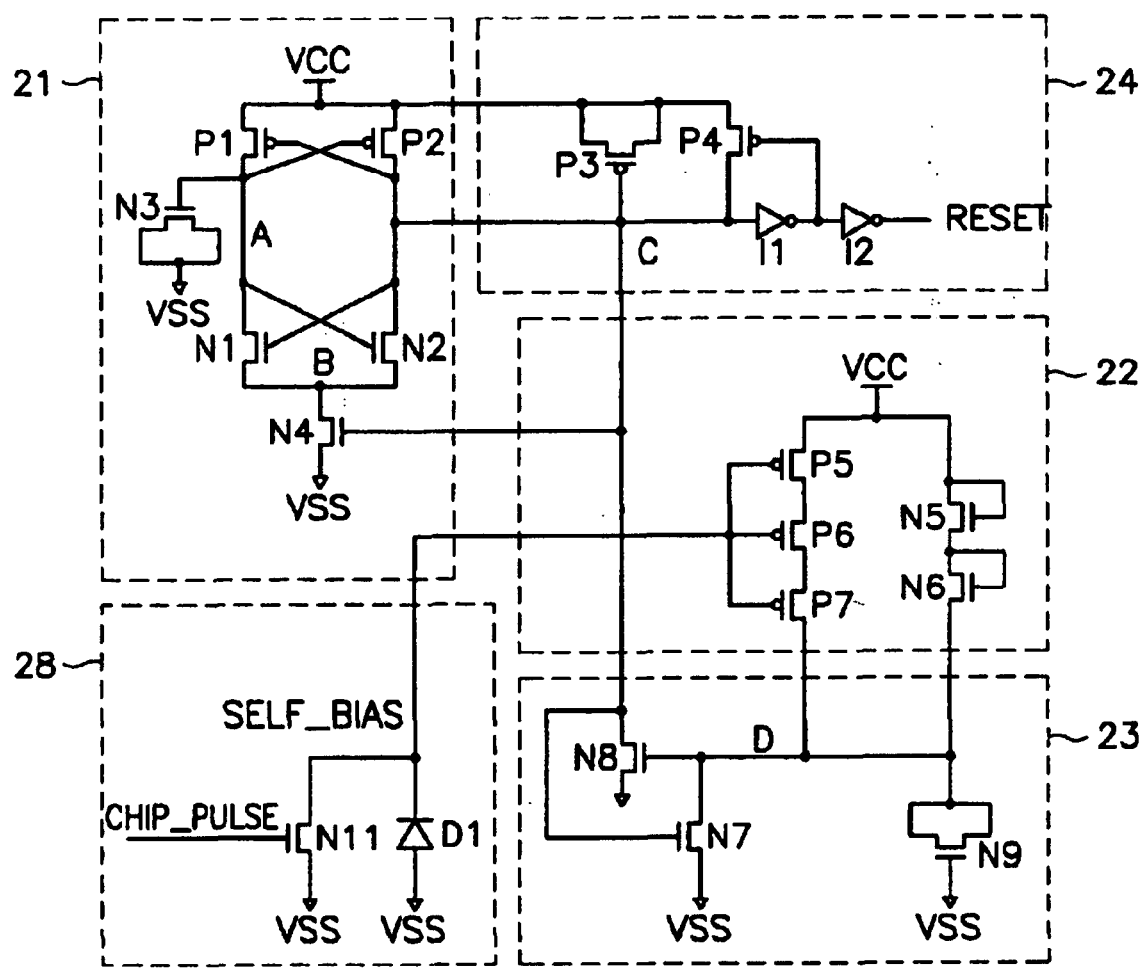
FIG. 13 is a circuit diagram showing a reset signal generating circuit according to a fourth example of the present invention.

FIGS. 12 and 13 are circuit diagrams showing a reset signal generating circuit according to a third example and a fourth example of the present invention. In the third example and the fourth example, a diode D1 is used instead of the NMOS transistor N10 of the first example and the second example.

The operation principle of these examples is omitted because it is the same with that of the first example and the second example.

The reset signal transition detector 30 generates a reset signal transition detecting signal RTD having a pulse type when the reset signal RESET outputted from the reset signal generator 20 is transited.

Figure 14:
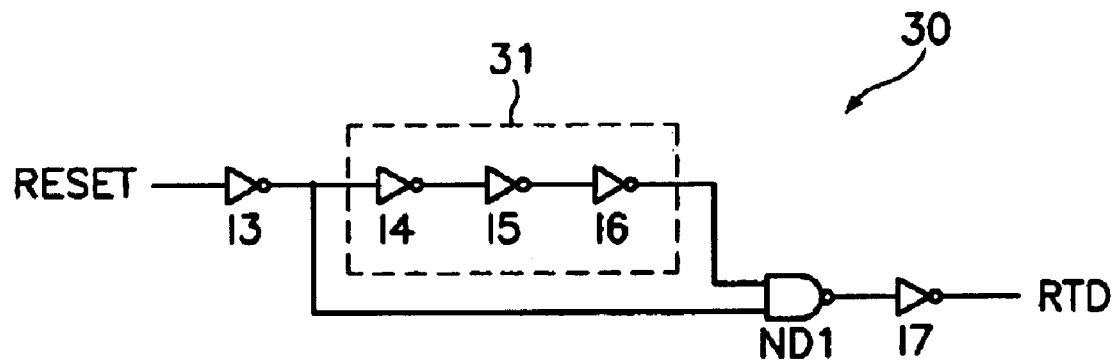
FIG. 14 is a circuit diagram showing a reset signal transition detector according to the present invention.

FIG. 14 is the circuit diagram showing a reset signal transition detector 30 of FIG. 7.

The reset signal transition detector 30 comprises an inverter I3, a first inversion delay unit 31 including inverters I4, I5 and I6 connected in series, a NAND gate ND1 and an inverter I7. The inverter I3 inverts a reset signal RESET. The first inversion delay unit 31 inverts and delays the reset signal inverted by the inverter I3 for a predetermined time. The NAND gate ND1 NANDs an output signal of the inverter I3 and an output signal of the first inversion delay unit 31. The inverter I7 inverts an output signal of the NAND gate ND1, and outputs the reset signal transition detecting signal RTD.

Figure 15:
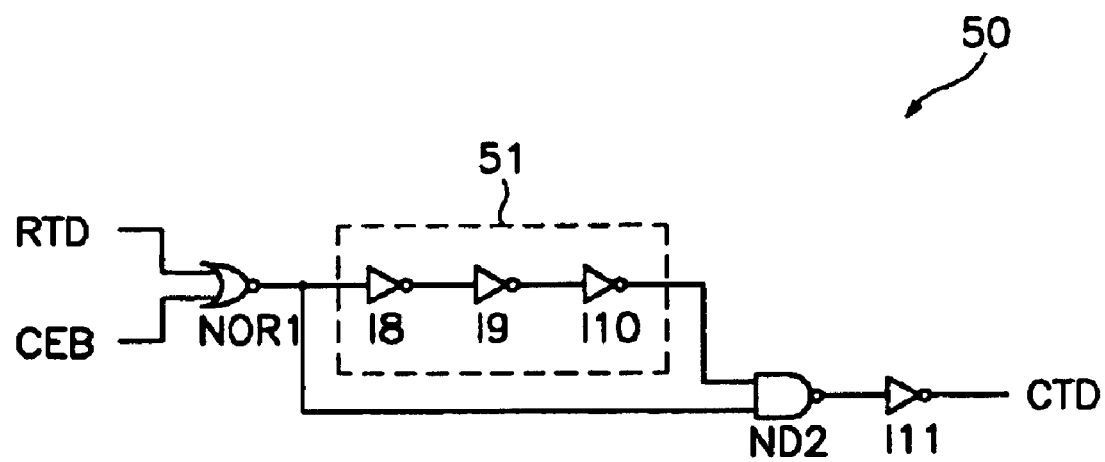
FIG. 15 is a circuit diagram showing a chip enable signal transition detector according to the present invention.

FIG. 15 is a circuit diagram showing the chip enable signal transition detector 50 of FIG. 7.

The chip enable signal transition detector 50 comprises a NOR gate NOR1, a second inversion delay unit 51 including inverters I8, I9 and I10 connected in series, a NAND gate ND2 and an inverter I11. The NOR gate NOR1 NORs the chip enable signal CEB and the reset signal transition signal RTD. The second inversion delay unit 51 inverts and delays an output signal of the NOR gate NOR1 for a predetermined time. The NAND gate ND2 NANDs an output signal of the NOR gate NOR1 and an output signal of the second inversion delay unit 51. The inverter I11 inverts an output signal of the NAND gate ND2, and outputs the chip enable transition detecting signal CTD.

The chip enable transition detecting signal CTD is generated when one of the chip enable signal CEB and the reset signal transition detecting signal RTD is transited from a high level to a low level.

Figure 16:
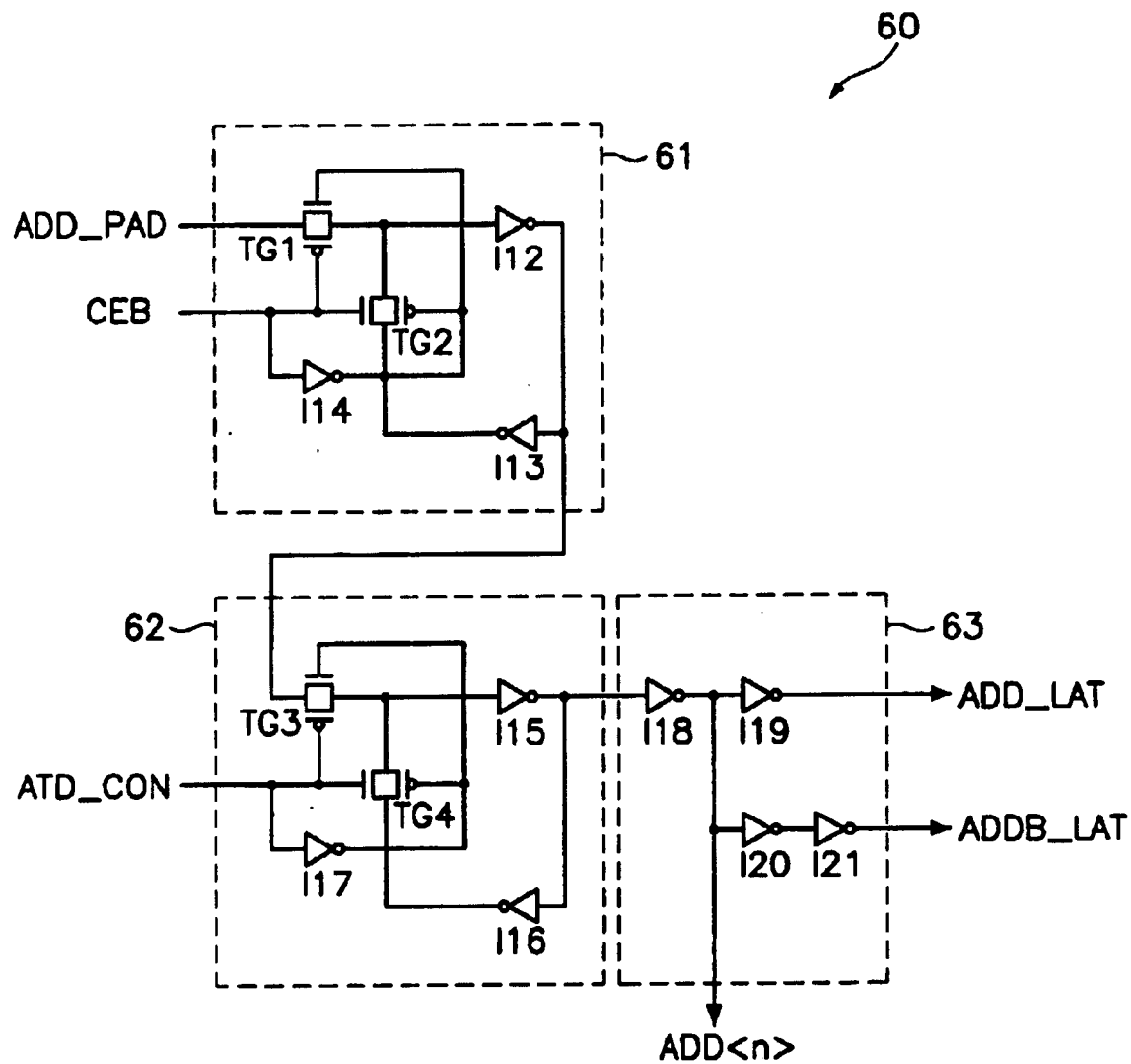
FIG. 16 is a circuit diagram showing an address latch according to the present invention.

FIG. 16 is a circuit diagram showing the address latch 60 of FIG. 7.

The address latch 60 comprises a first selection latch unit 61, a second selection latch unit 62 and a buffer unit 63. The first selection latch unit 61 selectively latches the address ADD_PAD inputted through the address pad in response to the chip enable signal CEB. The second selection latch unit 62 selectively latches an output signal of the first selection latch unit 61 in response to the address transition control signal ATD_CON. The buffer unit 63 buffers an output signal of the second selection latch unit 62, and outputs the address ADD and the latched addresses ADD_LAT and ADDB_LAT.

The first selection latch unit 61 comprises transmission gates TG1 and TG2, and inverters I12, I13 and I14. The transmission gate TG1 controlled by the chip enable signal CEB and a signal inverted by the inverter I14 selectively transmits the address ADD_PAD inputted through the address pad. The inverters I12 and I13 invert and latch a signal transmitted selectively by the transmission gate TG1. The transmission gate TG2 controlled by the chip enable signal CEB and a signal inverted by the inverter I14 selectively transmits an output signal of the inverter I4 into an input terminal of the inverter I12.

The second selection latch unit 62 comprises transmission gates TG3 and TG4, and inverters I15, I16 and I17. The transmission gate TG3 controlled by the address transition control signal ATD_CON and a signal inverted by the inverter I17 selectively transmits an output signal of the first selection latch unit 61. The inverters I15 and I16 invert and latch a signal transmitted selectively by the transmission gate TG3. The transmission gate TG4 controlled by the address transition control signal ATD_CON and a signal inverted by the inverter I17 selectively transmit an output signal of the inverter I16 into an input terminal of the inverter I15.

The buffer unit 63 comprises inverters I18, I19, I20 and I21. The inverter I18 inverts an output signal of the second selection latch unit 62, and outputs the address ADD. The inverter I19 inverts an output signal of the inverter I18, and output the latched address ADD_LAT. The inverters I20 and I21 sequentially invert an output signal of the inverter I18, and output the latched inversion address ADDB_LAT.

Here, if the address transition control signal ATD_CON is at a high level, the memory cell operation is in progress, and if it is at a low level, the memory cell receives a next address. The level of the address transition control signal ATD_CON is determined by activation of the memory cell operation.

Figure 17:
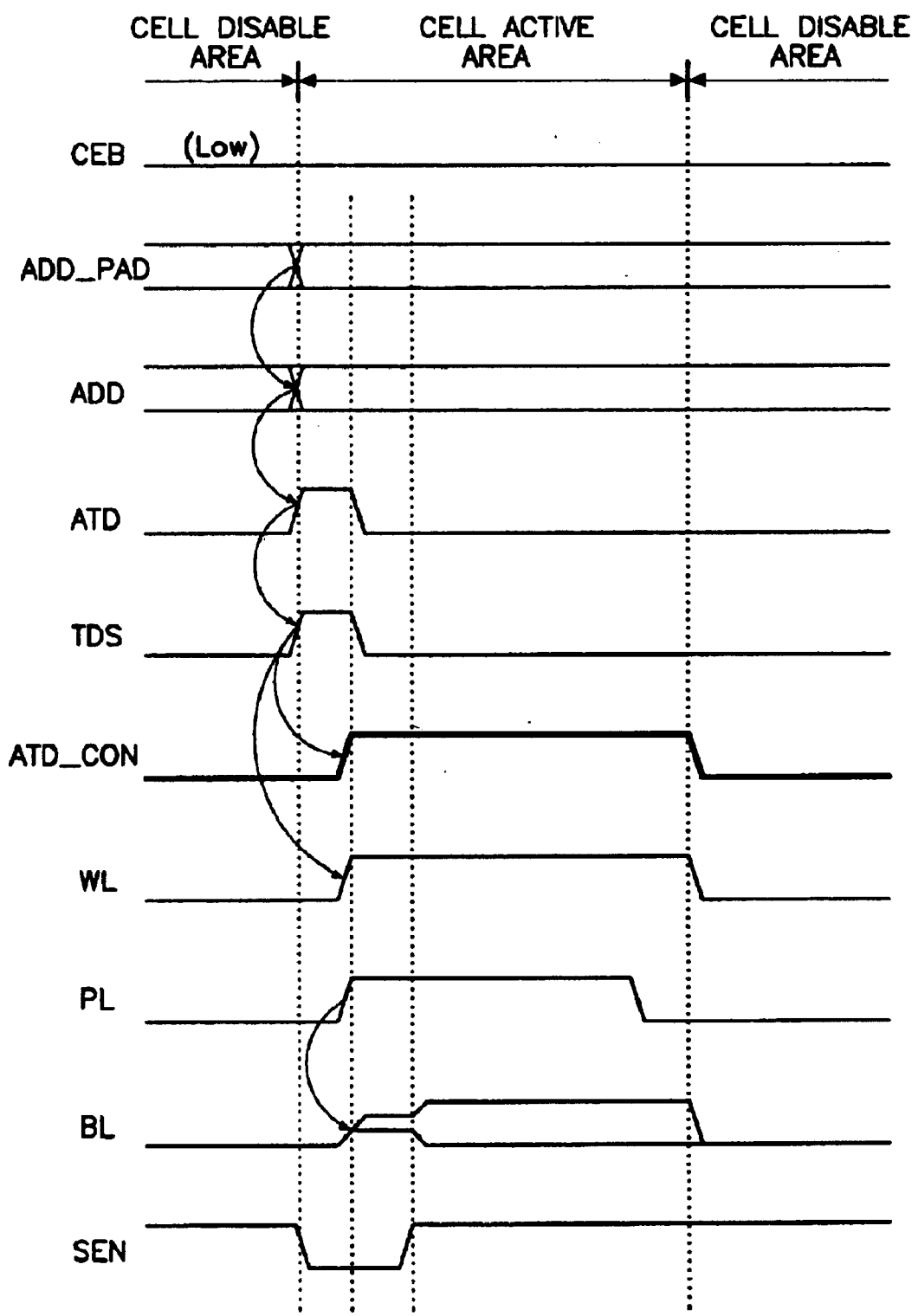
FIG. 17 is a timing diagram showing an address transition control signal when a chip enable signal is maintained at a low level.

FIG. 17 is a timing diagram showing the address transition control signal ATD_CON of FIG. 16 when the chip enable signal CEB is maintained at a low level.

The address transition control signal ATD_CON is transited to a high level when the memory cell operation is started, and automatically transited to a low level when the memory cell operation is finished. As a result, the second selection latch unit 62 stands by a next operation when the address transition control signal ATD_CON is at the high level.

Figure 18:
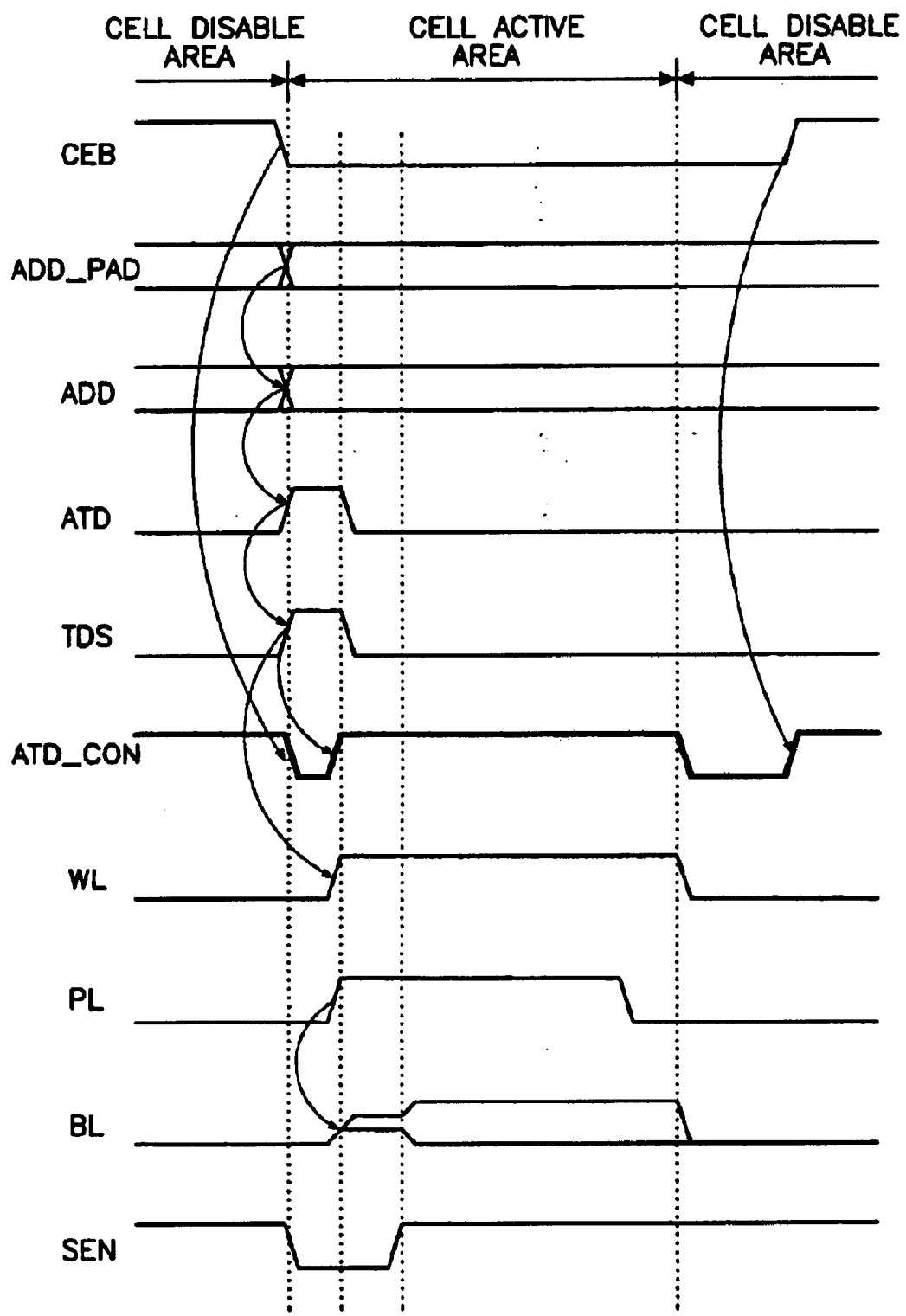
FIG. 18 is a timing diagram showing an address transition control signal when a chip enable signal is transited.

FIG. 18 is a timing diagram showing the address transition control signal ATD_CON of FIG. 16 when the chip enable signal CEB is transited.

The address transition control signal ATD_CON becomes at the high level when the chip enable signal CEB is at the high level. While the chip enable signal is at the high level, a new address is not inputted to the second selection latch unit 62 by the address transition control signal ATD_CON.

Thereafter, if the chip enable signal CEB becomes at the low level, the address transition control signal ATD_CON becomes at the low level, and receives the address latched in the first selection latch unit 61.

While the memory cell is activated and the chip enable signal CEB is at the high level, the address transition control signal ATD_CON becomes at the high level, and a new address is not inputted to the second selection latch unit 62 due to the address transition control signal ATD_CON. In the rest intervals, the second selection latch unit 62 receives an address from the first selection latch unit 61, and outputs the address into the buffer unit 63.

The chip enable transition signal CTD from the chip enable signal transition detector 50 and the address transition detecting signal ATD from the address transition detector 70 are synthesized in the synthesizer 80, and outputted as the synthesized transition detecting signal TDS for driving the wordline WL and the plateline PL of the memory cell.

The latched addresses ADD_LAT and ADDB_LAT outputted from the address latch 60 are decoded by the address decoder 90, and used to select a wordline or a column line.

As discussed earlier, a reset signal generating circuit of the present invention generates a reset signal by using a self-bias circuit regardless of a slope time of a power voltage only when the power voltage rises beyond a predetermined voltage. As a result, the reset signal generating circuit may generate a stable reset signal having excellent operation characteristics at short intervals even when the supply of the power source is repeatedly intercepted.

Additionally, the reset signal generation circuit may stabilize generation of control signals for controlling a nonvolatile FeRAM, thereby improving the operation characteristics of the memory device.

What is claimed is:

1. A reset signal generating circuit comprising:
   a power detector for maintaining the level of an applied voltage for a predetermined period;
   a threshold voltage controller for outputting a voltage by regulating the level of a power voltage for generating a reset signal depending on variations of the power voltage and a bias voltage;
   a feedback controller for pulling down an output voltage of the power detector when the power voltage reaches a predetermined level depending on an output voltage of the threshold voltage controller;
   a pull-up controller for pulling up an output voltage of the power detector and outputting an output voltage variation of the power detector as the reset signal; and
   a self-bias unit for outputting the bias voltage and regulating the amount of a current supplied from the threshold voltage controller to the feedback controller depending on variations of the power voltage.

2. The circuit according to claim 1, wherein the threshold voltage controller comprises:
   a voltage driver for outputting a voltage depending on variations of the power voltage to a predetermined level; and
   a voltage pull-up unit for pulling up the output voltage of the threshold voltage controller to the level of the power voltage by outputting a voltage depending on variations of the power voltage when the power voltage reaches beyond the level of the bias voltage, depending on the variations of the power voltage and the bias voltage.

3. The circuit according to claim 2, wherein the voltage driver comprises a plurality of MOS transistors connected in series between a power voltage terminal and the feedback controller and having a gate connected in common to a drain.

4. The circuit according to claim 2, wherein the voltage pull-up unit comprises a plurality of PMOS transistors connected in series between a power voltage terminal and the feedback controller and having a gate connected in common to the self-bias unit.

5. The circuit according to claim 2, wherein the self-bias unit comprises a first NMOS transistor connected between the voltage pull-up unit and a ground voltage terminal and having a gate connected in common to a source.

6. The circuit according to claim 5, wherein the self-bias unit further comprises a first switching device connected between the voltage pull-up unit and a ground voltage terminal and configured to turn on/off in response to an external control signal.

7. The circuit according to claim 2, wherein the self-bias unit is a diode having an input terminal connected to the voltage pull-up unit and an output terminal connected to a ground voltage terminal.

8. The circuit according to claim 7, wherein the self-bias unit further comprises a first switching device connected between the voltage pull-up unit and a ground voltage terminal and configured to turn on/off in response to an external control signal.

9. The circuit according to claim 2, wherein a bias voltage supplied to the voltage pull-up unit by the self-bias unit increases by a predetermined rate R,
   wherein the R is represented by R=CSC/(CSC+CST)× VCC (CSC: whole capacitance of the self bias unit, CST: coupling capacitance of the voltage pull-up unit, VCC: power voltage).

10. The circuit according to claim 1, wherein the feedback controller comprises:
    a second NMOS transistor connected between an output node of the threshold voltage controller and a ground voltage terminal and having a gate connected to an output node of the power detector;
    a third NMOS transistor connected between an output node of the power detector and a ground voltage terminal and having a gate connected to an output node of the threshold voltage controller; and
    a first MOS capacitor having a drain and a source connected in common to an output node of the threshold voltage controller, and a gate connected to a ground voltage terminal.

11. The circuit according to claim 1, wherein the power detector comprises:
    a power maintainer for maintaining and outputting the power voltage;
    a second MOS capacitor for providing a ground voltage to the power maintainer at an initial stage of the operation; and
    a second switching device for selectively providing a ground voltage to the power maintainer depending on an output voltage of the power detector.

12. The circuit according to claim 1, wherein the pull-up controller comprises:

a first PMOS transistor having a drain and a source connected in common to a power voltage terminal, and a gate connected to an output node of the power detector;

a first inverter for inverting a signal of an output node of the power detector;

a second PMOS transistor connected between the power voltage terminal and an output node of the power detector and having a gate connected to an output terminal of the first inverter; and a second inverter for inverting an output signal of the first inverter and outputting the inverted signal as a reset signal.

13. A nonvolatile ferroelectric memory device, comprising:

a reset generator for outputting a reset signal only when the power voltage is beyond a predetermined level regardless of a power-up slope;

a reset transition detector for detecting a transition point of the reset signal and outputting a reset signal transition detecting signal;

an address latch for latching an address inputted through an address pad in response to a chip enable signal and an address transition control signal;

an address transition detector for detecting a transition point of an address outputted from the address latch and outputting an address transition detecting signal;

a chip enable transition detector for detecting transition points of the chip enable signal and the reset signal transition detecting signal and outputting a chip enable transition detecting signal; and a synthesizer for synthesizing the address transition detecting signal and the chip enable signal transition detecting signal and outputting the synthesized signal.

14. The device according to claim 13, further comprising a buffer for receiving the chip enable signal through a chip enable pad and outputting the signal into the chip enable signal transition detector.

15. The device according to claim 13, further comprising a programmable circuit block including nonvolatile programmable code registers for programming inputs and outputs by using a reset signal transition detecting signal from the reset signal transition detector.

16. The device according to claim 13, wherein the reset signal generator comprises:

a power detector for maintaining the size of an applied voltage for a predetermined period;

a threshold voltage controller for regulating the level of the power voltage for generating a reset signal by regulating an output voltage depending on variations of the power voltage and a bias voltage;

a feedback controller for pulling down an output voltage of the power detector when the power voltage reaches a predetermined level depending on an output voltage of the threshold voltage controller;

a pull-up controller for pulling up an output voltage of the power detector and outputting a variation in an output voltage of the power detector as the reset signal; and a self-bias unit for outputting the bias voltage and regulating the amount of a current supplied from the threshold voltage controller to the feedback controller depending on variations of the power voltage.

17. The device according to claim 16, wherein the reset signal transition detector outputs the reset signal transition detecting signal having a pulse type when a reset operation is started.

18. The device according to claim 14, wherein the address latch unit receives and outputs an address while the chip enable signal and the address transition control signal are at disable states.

19. The device according to claim 18, wherein the address latch unit comprises:

a first selection latch unit for selectively latching an address inputted in response to a chip enable signal;

a second selection latch unit for selectively latching a signal outputted from the first selection latch unit in response to an address transition control signal; and a buffer unit for buffering a signal outputted from the second selection latch unit and outputting the buffered signal.

* * * * *